United States Patent [19]
Tomishima

[11] Patent Number: 5,612,920
[45] Date of Patent: Mar. 18, 1997

[54] SEMICONDUCTOR MEMORY DEVICE HAVING A VOLTAGE DOWN CONVERTER FOR GENERATING AN INTERNAL POWER SUPPLY VOLTAGE FROM AN EXTERNAL POWER SUPPLY

[75] Inventor: Shigeki Tomishima, Hyogo, Japan

[73] Assignee: Mitsubishi Denki Kabushiki Kaisha, Tokyo, Japan

[21] Appl. No.: 529,961

[22] Filed: Sep. 19, 1995

[30] Foreign Application Priority Data

Nov. 28, 1994 [JP] Japan .................................. 6-293311

[51] Int. Cl.$^6$ .................................................. G11C 8/00
[52] U.S. Cl. ................ 365/226; 365/189.09; 365/189.11
[58] Field of Search .................................. 365/226, 227, 365/189.09, 189.11

[56] References Cited

U.S. PATENT DOCUMENTS

| | | | |
|---|---|---|---|
| 5,046,052 | 9/1991 | Miyaji et al. | 365/226 |
| 5,153,452 | 10/1992 | Iwamura et al. | 365/226 X |
| 5,249,155 | 9/1993 | Arimoto et al. | 365/222 |

FOREIGN PATENT DOCUMENTS 3-212893  9/1991  Japan .
5-217370  8/1993  Japan .
6-131869  5/1994  Japan .

OTHER PUBLICATIONS

"A 45–ns 16–Mbit DRAM with Triple–Well Structure" IEEE Journal of Solid–State Circuits, vol. 24, No. 5, 1989, pp. 1170–1175.
"An Experimental 4Mb CMOS DRAM" ISSCC Digest of Technical Papers 1986, pp. 272–273.

Primary Examiner—Joseph A. Popek
Attorney, Agent, or Firm—Lowe, Price, LeBlanc & Becker

[57] ABSTRACT

Voltage down converter of a semiconductor memory device shown includes a reference voltage generating circuit, a current mirror amplifier for comparing the reference voltage Vref with internal power supply voltage intVcc, and a PMOS receiving at its gate an output from the current mirror amplifier. Further, the voltage down converter includes a $\phi s$ generating circuit for generating a signal $\phi s$ before the operation of sense amplifier, and a PMOS receiving at its gate the signal $\phi s$. Voltage down converter generates the internal power supply voltage intVcc such as shown in FIG. 8, before the operation of sense amplifier. Therefore, the voltage down converter can supply a stable internal power supply voltage intVcc, and prevents considerable lowering of the level of the internal power supply voltage intVcc caused by the operation of the sense amplifier.

11 Claims, 9 Drawing Sheets

SEMICONDUCTOR MEMORY DEVICE HAVING A VOLTAGE DOWN CONVERTER FOR GENERATING AN INTERNAL POWER SUPPLY VOLTAGE FROM AN EXTERNAL POWER SUPPLY

BACKGROUND OF THE INVENTION

1. Field of the Invention

The present invention relates to a semiconductor memory device and, more specifically, to a semiconductor memory device having a voltage down converter for stabilizing internal power supply voltage level and for realizing higher speed of operation of internal circuitry such as a sense amplifier operating based on an internal power supply voltage.

2. Description of the Background Art

A voltage down converter (VDC) in a semiconductor memory device is disclosed, for example, in Japanese Patent Laying-Open Nos. 6-131869, 3-212893, 5-217370, in IEEE Journal of Solid-State Circuits vol. 24, No. 5, 1989, pp. 1170–1175, and in ISSCC Digest of Technical Papers, 1986, pp. 272–273.

FIG. 11 is a schematic diagram showing a semiconductor memory device having such a conventional voltage down converter (VDC).

Referring to FIG. 11, the VDC includes a level converting circuit 91 for converting level of an activating signal S generated in an internal circuitry 90, a one shot pulse generating circuit 93 for turning the output from level converting circuit 91 to a one shot pulse, and a P channel MOS transistor 15 (hereinafter referred to as a "PMOS") receiving at its gate the output from one shot generating circuit 93 and having its source connected to a node of external power supply voltage extVcc and its drain connected to a node of internal power supply voltage intVcc.

Further, the VDC includes a reference voltage generating circuit 97, a current mirror amplifier 11 for comparing a reference voltage $V_{REF}$ generated by the reference voltage generating circuit 97 with the voltage level of internal power supply voltage intVcc and a PMOS 13 receiving at its gate the output from current mirror amplifier 11 and having its source connected to the node of external power supply voltage extVcc and its drain connected to the node of internal power supply voltage intVcc.

FIG. 12 is a diagram of signal waveforms in the semiconductor memory device having the VDC shown in FIG. 11.

The operation of the semiconductor memory device having the VDC of FIG. 11 will be described with reference to FIG. 12.

It is assumed that at time $t_1$, internal circuitry 90 consumes much current from the voltage level of internal power supply voltage intVcc and the level at the node of the internal power supply voltage intVcc begins to lower.

At time $t_0$ before the start of lowering of the level of internal power supply voltage intVcc, activating signal S changes from "L" (Low) to "H" (High) (intVcc level), and in response, the voltage level at node N1 changes from "L" to "H" (extVcc level) by the operation of level converting circuit 91.

By the one shot pulse generating circuit 93, there is a one shot pulse on the side of "L" is generated at node N2 between times $t_1$ and $t_3$.

During this period, PMOS 15 is on, and voltage is rapidly supplied from the node of external power supply voltage Vcc to the node of internal power supply voltage intVcc.

Further, at time $t_2$, because of the function of current mirror amplifier 11 incidental to the level lowering of internal power supply intVcc, the voltage level at node N3 lowers gradually, and hence PMOS 13 turns on, so that voltage is applied from the node of external power supply voltage extVcc to the node of internal power supply voltage intVcc.

At time t4, when the voltage level of internal power supply voltage intVcc is recovered, the voltage level at node N3 is also recovered, and PMOS 13 turns off.

In this manner, in the semiconductor memory device having a conventional VDC, voltage is supplied from the node of external power supply voltage extVcc to the node of internal power supply voltage intVcc by a one shot pulse in response to a prescribed signal generated from an internal circuit, timed with lowering of the voltage level of internal power supply voltage intVcc.

Further, current mirror amplifier 11 detects actual lowering of the voltage level in internal power supply voltage intVcc and turns PMOS 13 on, so that voltage is supplied from the node of external power supply voltage extVcc to the node of internal power supply voltage intVcc.

However, even when the structure of FIG. 11 is used, the voltage level of internal power supply voltage intVcc still lowers by $\Delta V$. Further, it takes time $(t_4-t_1)$ until the voltage level of internal power supply voltage intVcc is fully recovered.

Accordingly, operations of the internal circuitry 90 and peripheral circuits, not shown, may be affected.

SUMMARY OF THE INVENTION

In view of the foregoing, an object of the present invention is to provide a semiconductor memory device having a voltage down converter (VDC) for preventing lowering of the level of internal power supply voltage intVcc because of the operation of internal circuitry, supplying stable internal power supply voltage intVcc and for reducing time necessary for level recovery.

Another object of the present invention is to provide a semiconductor memory device having a VDC for generating an internal power supply voltage intVcc for accelerating operation of a sense amplifier when the sense amplifier is used as an internal circuitry of a semiconductor memory device, for increasing drivability and hence for improving speed of operation of the sense amplifiers in the whole semiconductor memory device.

The semiconductor memory device in accordance with the present invention having a voltage down converter for generating an internal power supply voltage based on an external power supply voltage includes a voltage down converter and an internal circuitry, and the voltage down converter includes a first voltage lowering circuit, a first control circuit, a reference voltage generating circuit, a second voltage lowering circuit and a second control circuit.

The first voltage lowering circuit lowers the external power supply voltage, and generates an internal power supply voltage. The first control circuit performs control such that the first voltage lowering circuit operates prior to the operation of the internal circuit which operates based on the internal power supply voltage. The second voltage lowering circuit is connected parallel to the first voltage lowering circuit, and generates an internal power supply voltage by lowering the external power supply voltage. The second control circuit compares the internal power supply voltage with a reference voltage generated by the reference voltage generating circuit, detects lowering of the internal power supply voltage, and operates the second voltage lowering circuit.

Therefore, an advantage of the present invention is that, since (1) a circuit for generating an internal power supply voltage a prescribed time period before the operation of the internal circuitry operating based on the internal power supply voltage starts, and (2) a circuit for generating an internal power supply voltage by detecting lowering in level of the internal power supply voltage because of the operation of the internal circuitry are provided, a stable internal power supply voltage of which level lowering is small can be supplied, and influence to the peripheral circuitry caused by the level lowering of the internal power supply voltage can be reduced.

Another advantage of the present invention is that since the internal power supply voltage is generated prescribed time period before the operation of a voltage amplifying circuit amplifying potential difference between a bit line pair connected to a selected memory cell, the lowering of the level in the internal power supply voltage because of the operation of the potential difference amplifying circuit is small, the time necessary for full recovery of the level can be shortened, and the speed of operation of the potential difference amplifying circuit can be increased.

A still further advantage of the present invention is, since an internal power supply voltage of the level of the external power supply voltage is generated for a prescribed time period, a prescribed time period before the operation of the sense amplifier, the potential difference between the gate and the source of the PMOS constituting the sense amplifier becomes larger, the sense amplifier operates faster, and drivability is increased, so that the speed of operation of the sense amplifier can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor memory device in accordance with the present invention will be described with reference to the figures.

First Embodiment

Figure 1:
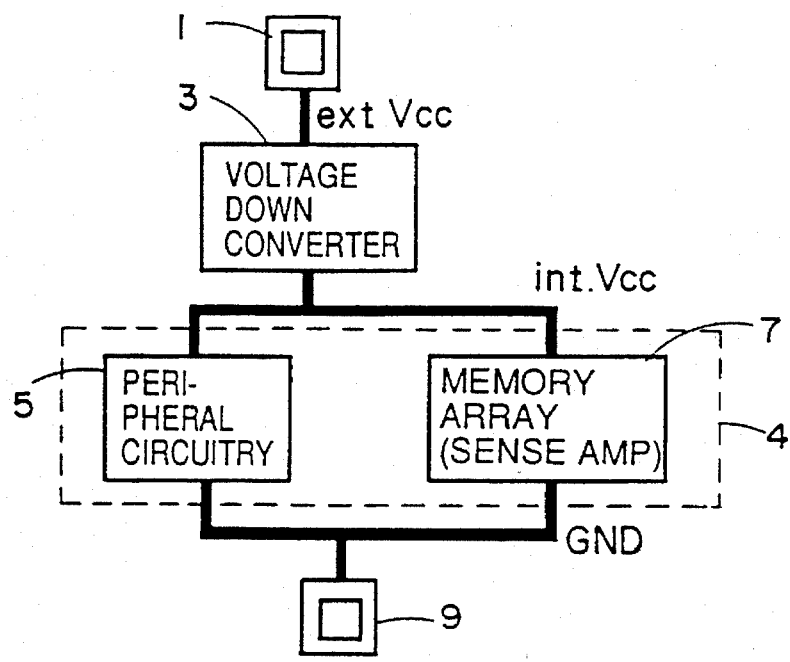
FIG. 1 is a schematic block diagram showing a whole structure of a semiconductor memory device in accordance with a first embodiment of the present invention.

FIG. 1 is a schematic block diagram showing a whole structure of a semiconductor memory device in accordance with the first embodiment of the present invention.

In the semiconductor memory device of FIG. 1, an external power supply voltage extVcc is supplied from an external power supply pad 1 to the inside of the semiconductor memory device. At this time, in order to reduce current consumption in the semiconductor memory device, an internal power supply voltage intVcc for operating an internal circuitry 4 in the semiconductor memory device is generated, by lowering the external power supply voltage extVcc.

More specifically, the external power supply voltage extVcc supplied from the external power supply pad 1 is lowered by a voltage down converter (VDC) 3, and the internal power supply voltage intVcc is supplied entirely to the inside of semiconductor memory device.

The internal power supply voltage intVcc is consumed by internal circuitry 4 including a peripheral circuitry 5 and a memory array (especially, sense amplifiers) 7. Though not shown, the peripheral circuitry 5 includes a row decoder, a data input/output circuit and so on.

Meanwhile, GND level is input through an external ground pad 9, and it is supplied to the entire semiconductor memory device.

Figure 2:
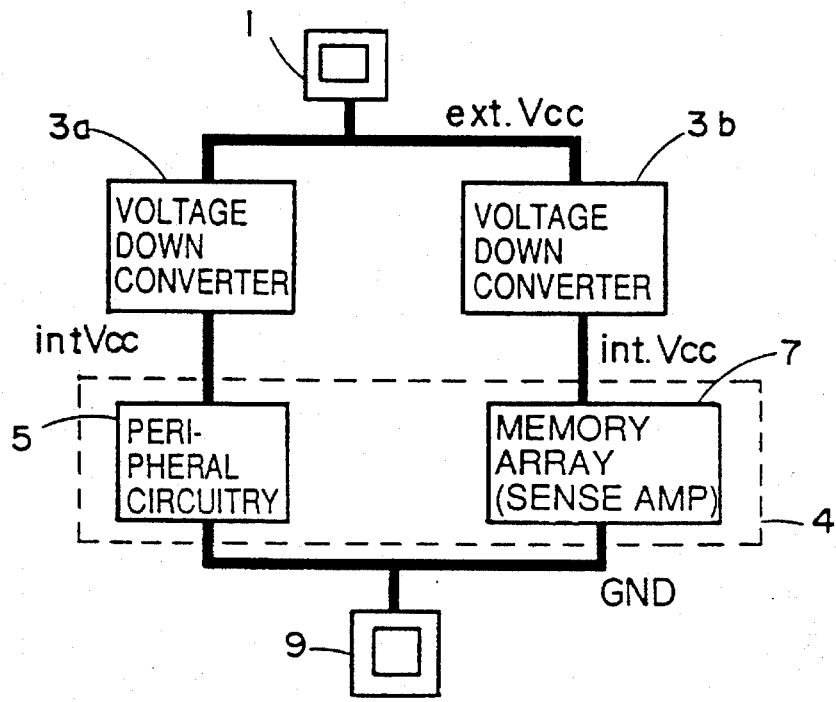
FIG. 2 is a schematic block diagram showing a whole structure of another example of a semiconductor memory device in accordance with the first embodiment.

FIG. 2 is a schematic block diagram showing the overall structure of another example of the semiconductor memory device in accordance with the first embodiment of the present invention.

In the semiconductor memory device of FIG. 2, the external power supply voltage extVcc is supplied from external power supply pad 1 to the inside of the semiconductor memory device. At this time, in order to reduce current consumption in the semiconductor memory device, an internal power supply voltage intVcc for operating internal circuitry 4 of the semiconductor memory device is generated by lowering the external power supply voltage extVcc.

More specifically, by a voltage down converter 3a for peripheral circuit 5 and a voltage down converter 3b for memory array (especially for sense amplifier) 7, the external power supply voltage extVcc supplied from external power supply pad 1 is lowered, internal power supply voltages (intVcc1, intVcc2) are generated, and the internal power supply voltages are separately supplied to peripheral circuit 5 and memory array (sense amplifier) 7. In this example of FIG. 2 also, peripheral circuit 5 and memory array (sense amplifier) 7 constitute internal circuitry 4.

Meanwhile, GND level is input through external ground pad 9, and it is supplied to the entire semiconductor memory device.

Figure 3:
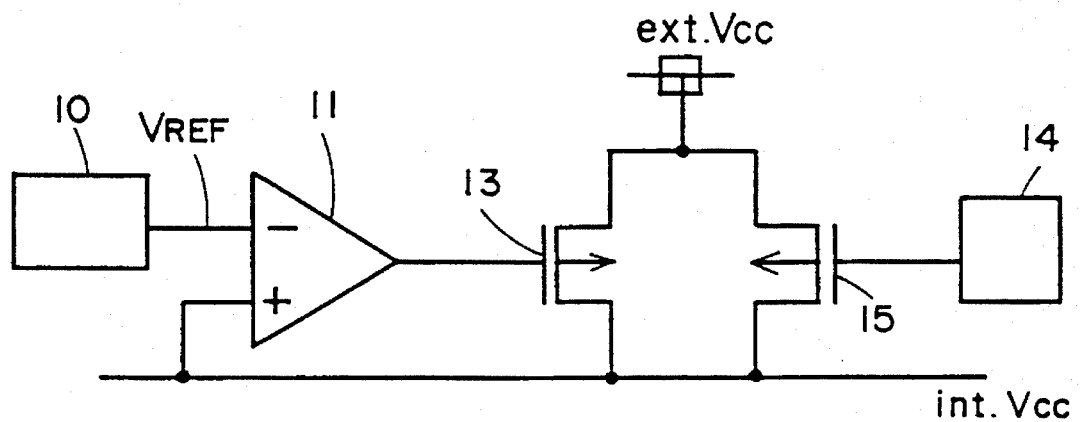
FIG. 3 is a schematic diagram showing details of a voltage down converter (VDC) in accordance with the first embodiment.

FIG. 3 shows details of the voltage down converter (VDC) 3, 3a and 3b shown in FIGS. 1 and 2.

Referring to FIG. 3, the VDC includes a reference voltage generating circuit 10, a current mirror amplifier 11 for comparing the reference voltage $V_{REF}$ and the voltage level of internal power supply voltage intVcc, and a P channel MOS transistor (hereinafter referred to as "PMOS") 13 receiving at its gate the output from current mirror amplifier 11 and having its source connected to the node of external power supply voltage extVcc and its drain connected to the node of internal power supply voltage intVcc.

In response to the result of comparison between internal power supply voltage intVcc and reference voltage $V_{REF}$ (by detecting lowering of the level in internal power supply voltage), PMOS 13 is turned on, so that the external power supply voltage extVcc is lowered to generate the internal power supply voltage intVcc.

Further, the VDC includes a φs generating circuit 14 for generating a signal φs a prescribed time before the operation of internal circuitry 4 shown in FIGS. 1 and 2 (that is, before the level of the internal power supply voltage starts to lower), and a PMOS 15 connected between the node of internal power supply voltage intVcc and the node of external power supply voltage extVcc, receiving at its gate the signal φs, and for generating the internal power supply voltage intVcc by lowering the external power supply voltage extVcc.

Figure 4:
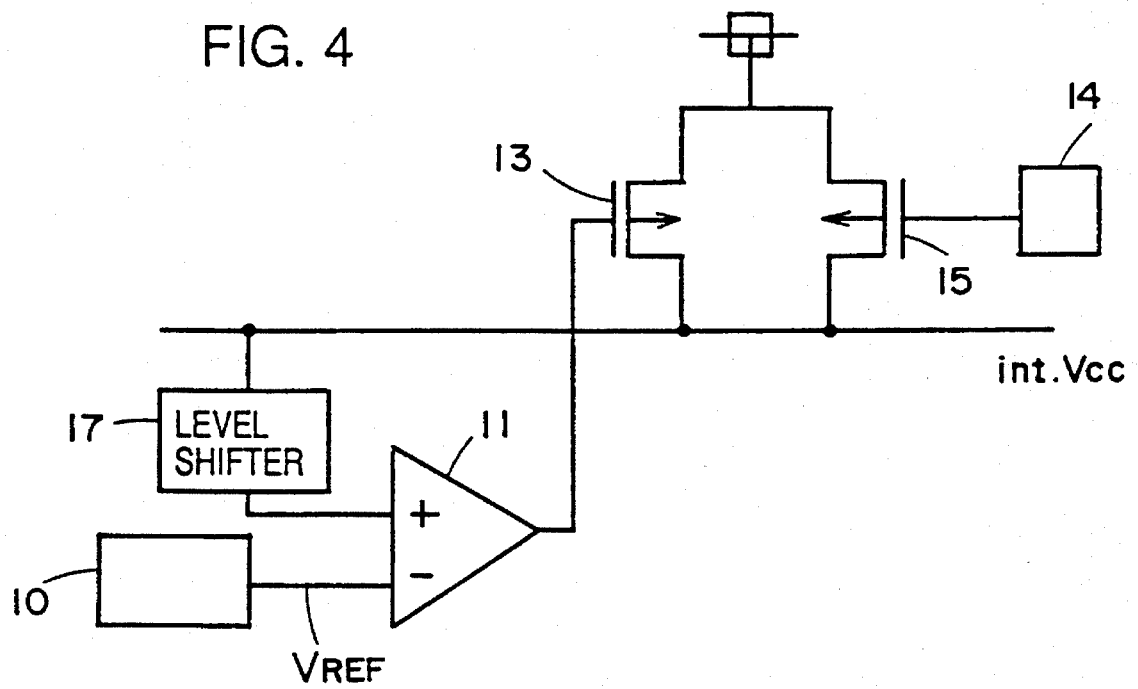
FIG. 4 is a schematic diagram showing details of another example of the voltage down converter (VDC) in accordance with the first embodiment.

FIG. 4 shows details of another example of the voltage down converter 3, 3a, 3b.

Referring to FIG. 4, the VDC includes a reference voltage generating circuit 10, a level shifter 17, a current mirror amplifier 11 for comparing the reference voltage $V_{REF}$ and the voltage level of the internal power supply voltage intVcc shifted by the level shifter 17, and a PMOS 13 receiving at its gate the output from current mirror amplifier 11 and having its source connected to the node of external power supply voltage extVcc and its drain connected to the node of internal power supply voltage intVcc.

In response to the result of comparison between shift voltage $V_{SHIF}$ and the reference voltage $V_{REF}$ (by detecting lowering of the level in internal power supply voltage), PMOS 13 is turned on so that the external power supply voltage extVcc is lowered to generate the internal power supply voltage intVcc.

The VDC further includes a φs generating circuit 14 for generating a signal φs a prescribed time period before the operation of the internal circuitry 4 shown in FIGS. 1 and 2 (i.e. before lowering of the level of internal power supply voltage), and a PMOS 15 connected between the node of internal power supply voltage intVcc and the node of external power supply voltage extVcc, receiving at its gate the signal φs, and for generating the internal power supply voltage intVcc by lowering the external power supply voltage extVcc.

Figure 5:
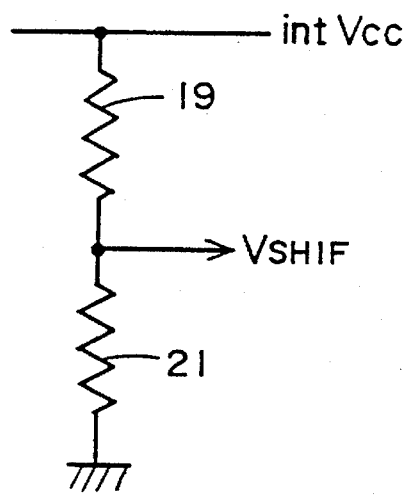
FIG. 5 is a schematic diagram showing details of a level shifter in accordance with the first embodiment.

FIG. 5 is an exemplary schematic diagram showing details of the level shifter 17 shown in FIG. 4.

Referring to FIG. 5, the level shifter includes resistances 19 and 21 connected in series between the internal power supply and the ground.

The internal power supply voltage intVcc is shifted by resistance 19, and thus shifted voltage $V_{SHIF}$ is generated.

As a result, in the semiconductor memory device in accordance with the first embodiment, the internal power supply voltage intVcc is generated by lowering the external power supply voltage extVcc a prescribed time period before the start of lowering of the internal power supply voltage level, and therefore lowering of the level in internal power supply voltage intVcc at the operation of the internal circuitry can be prevented, and thus a stable internal power supply voltage intVcc can be supplied.

Second Embodiment

The overall structure of the semiconductor memory device in accordance with the second embodiment of the present invention is similar to that of the semiconductor memory device in accordance with the first embodiment. The structure of the VDC in the second embodiment is also the same as that of the VDC in the first embodiment shown in FIGS. 3 and 4.

Of the internal circuitry 4, the VDC for the sense amplifier will be described.

Figure 6:
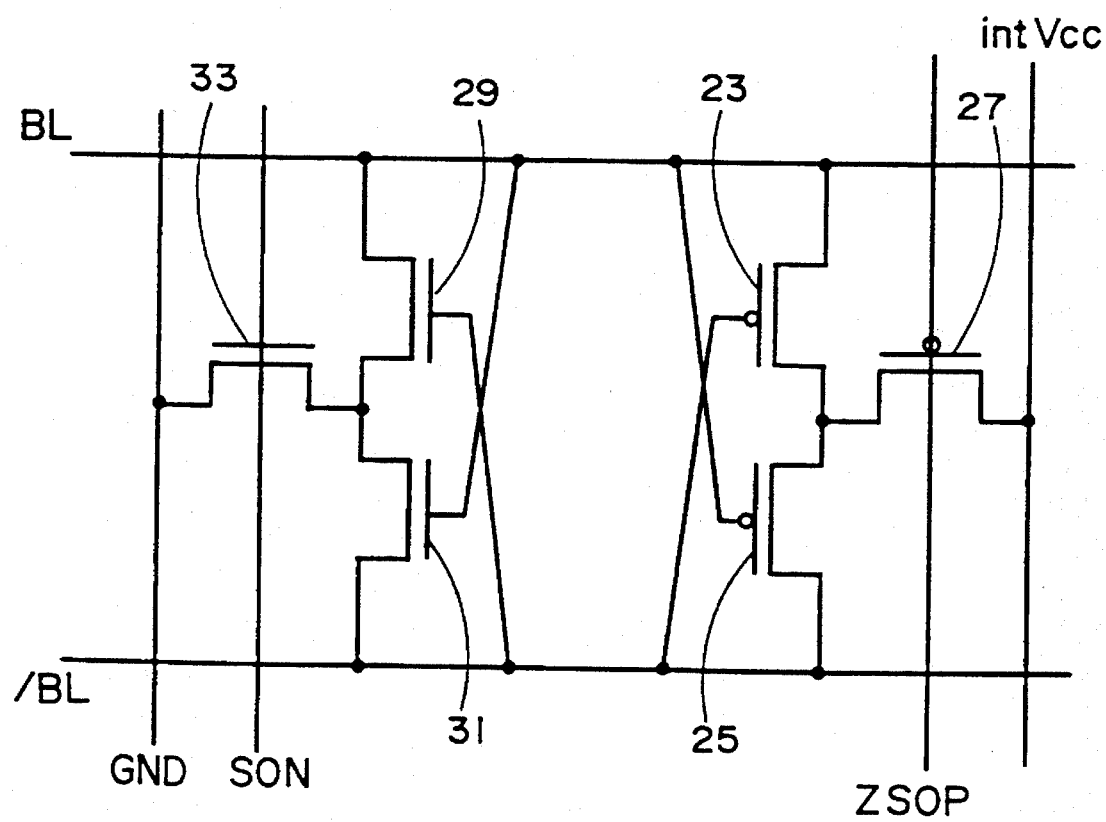
FIG. 6 is a schematic diagram showing details of a sense amplifier in accordance with a second embodiment of the present invention.

FIG. 6 shows details of the sense amplifier.

Referring to FIG. 6, a cross coupled type sense amplifier (hereinafter referred to as "P channel sense amplifier") including two P channel MOS transistors (hereinafter referred to as "PMOSs") 23, 25 is connected to the node of internal power supply voltage intVcc through a PMOS 27 receiving at its gate a P channel sense amplifier activating signal ZSOP. Further, a cross coupled type sense amplifier (hereinafter referred to as "N channel sense amplifier") including two N channel MOS transistors (hereinafter referred to as "NMOSs") 29, 31 is connected to GND through an NMOS 33 receiving at its gate an N channel sense amplifier activating signal SON.

In the following, voltage down converter (3, 3b) providing the internal power supply voltage intVcc for operating the P channel sense amplifier by lowering the external power supply voltage extVcc will be described.

Figure 7:
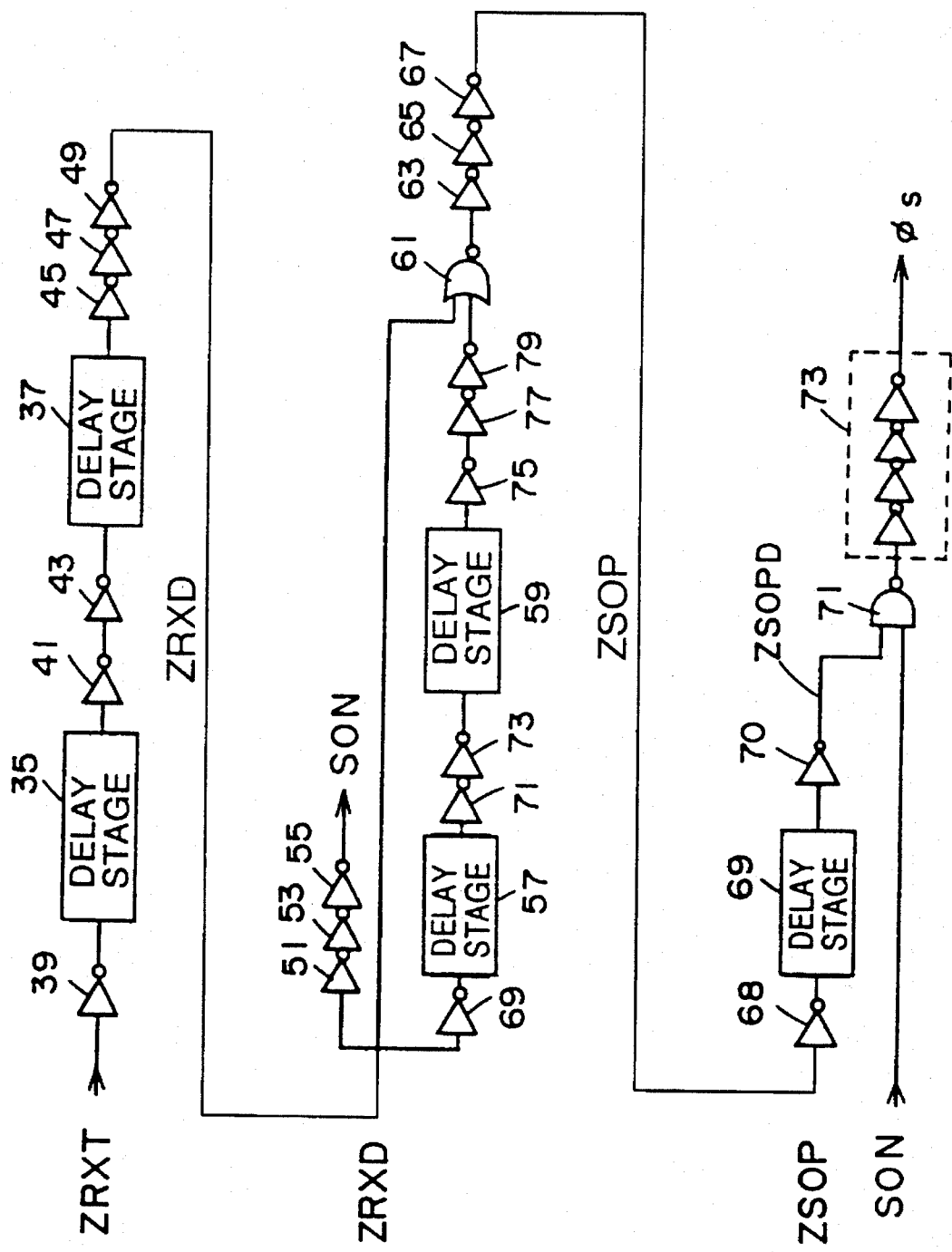
FIG. 7 is a schematic diagram showing an example of a φs generating circuit for generating a signal φs for turning on the voltage down converter prior to the P channel sense amplifier activating signal ZSOP and for generating an internal power supply voltage intVcc close to the level of the external power supply voltage extVcc.

FIG. 7 is a schematic diagram showing an example of the φs generating circuit 14 for turning on the voltage down converter earlier than the P channel sense amplifier activating signal ZSOP and for generating the internal power supply voltage intVcc (corresponding to signal φs of FIGS. 3 and 4).

Referring to FIG. 7, the φs generating circuit delays the base signal ZRXT based on the row address strobe signal by means of delay stages 35 and 37 consisting of a plurality of inverters, not shown, and thus a delayed signal ZRXD is obtained.

Inverters 39, 41, 43, 45, 47 and 49 are provided for shaping waveform of the delayed signal ZRXD.

Referring to FIG. 7, the delayed signal ZRXD is further delayed by three inverters 51, 53 and 55 and provided as an N channel sense amplifier activating signal SON.

Further, the delayed signal ZRXD is again delayed by delay stages 57 and 59 consisting of inverters, not shown, and thus the twice delayed ZRXD signal is input, together with the once delayed ZRXD signal, to the NOR circuit 61.

The output from NOR circuit 61 has its waveform shaped by inverters 63, 65 and 67, and provided as a P channel sense amplifier activating signal ZSOP.

The inverters 69, 71, 73, 75, 77 and 79 provided in the preceding stage of NOR circuit 61 is for shaping waveform of an input to the NOR circuit.

Referring to FIG. 7, the P channel sense amplifier activating signal ZSOP is delayed by delay stage 69, and input to NAND circuit 71 together with N channel sense amplifier activating signal SON.

The output from NAND circuit 71 has its waveform shaped by three inverters 73, and provided as a signal φs for operating the voltage down converter earlier than the P channel sense amplifier activating signal ZSOP. Inverters 68 and 70 are provided for shaping waveforms of the input/output.

Figure 8:
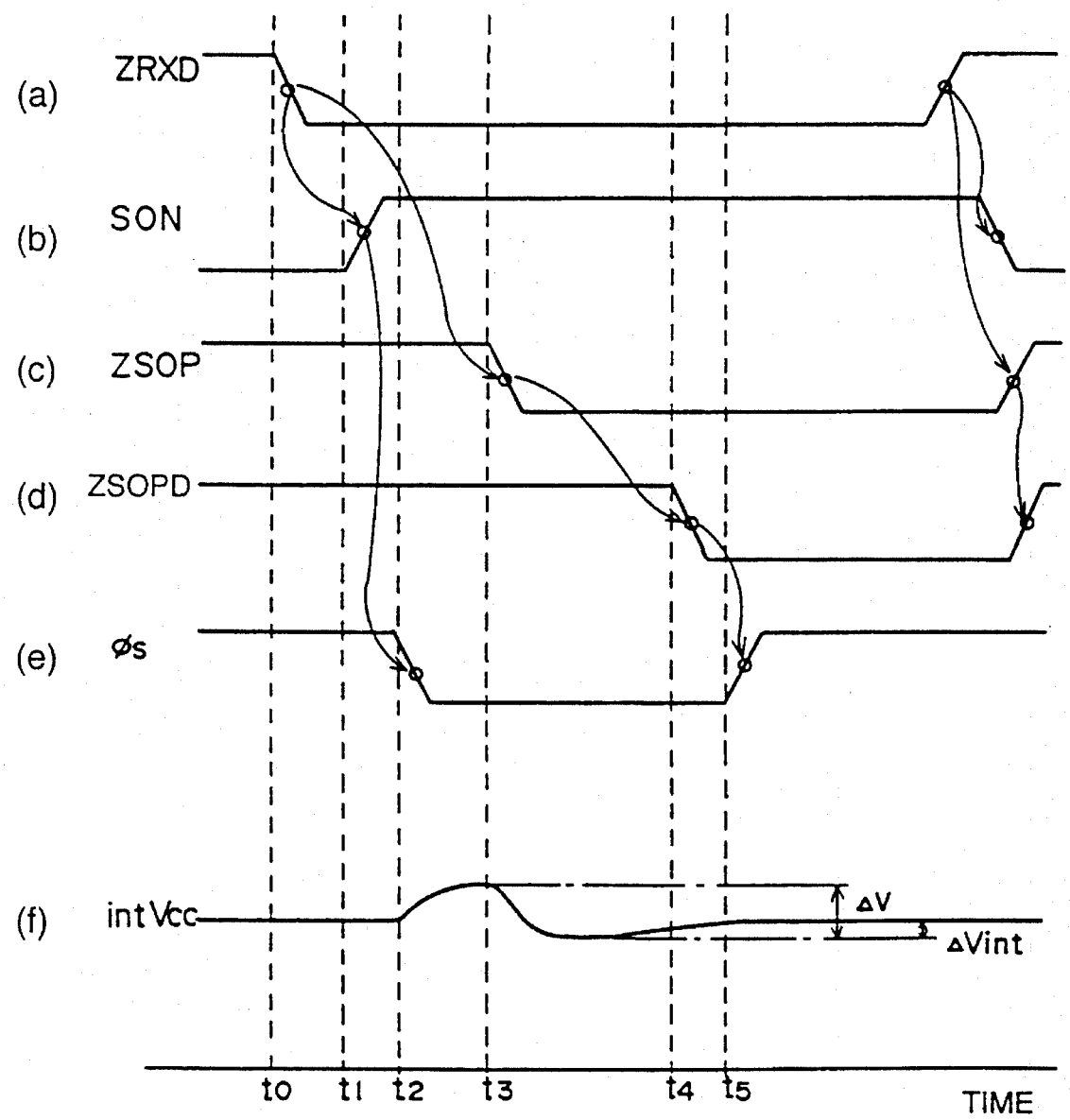
FIG. 8 shows waveforms of the φs generating circuit and the level of the internal power supply voltage intVcc in accordance with the second embodiment.

FIG. 8 is a diagram of signal waveforms of the φs generating circuit shown in FIG. 7.

FIG. 8 shows main clock signals representing the operation of the φs generating circuit shown in FIG. 7 as well as the level of the internal power supply voltage intVcc.

The clock signal includes the signal ZRXD provided by delaying the signal ZRXT based on the row address strobe signal, the N channel sense amplifier activating signal SON, the P channel sense amplifier activating signal ZSOP and the signal ZSOPD provided by delaying the signal ZSOP.

The operation of the φs generating circuit shown in FIG. 7 will be described with reference to FIG. 8.

When the signal ZRXD obtained by delaying the signal ZRXT based on the row address strobe signal starts to fall to the L level at time $t_0$, N channel sense amplifier activating signal SON starts to rise to the H level at time $t_1$. At this time ($t_1$), P channel sense amplifier activating signal ZSOP is at the H level, and the output from NAND circuit 71 is at the L level.

More specifically, at time $t_2$, the signal φs starts to fall to the L level, PMOS 15 of the voltage down converter shown in FIGS. 3 and 4 is turned on, and thus a voltage is supplied to the node of the internal power supply voltage intVcc.

Thereafter, at time $t_3$, P channel sense amplifier activating signal ZSOP starts to fall to the L level, and thus P channel sense amplifier is turned on.

Further, at time $t_4$, the signal ZSOPD which is provided based on the signal ZSOP delayed by the delay stage 69 starts to fall to the L level.

At this time $t_4$, SON is at the H level, and the output from NAND circuit 71 is at the H level.

More specifically, at time $t_5$, the signal φs starts to rise to the H level, PMOS 15 of the circuit shown in FIGS. 3 and 4 is turned off, and thus supply of the voltage is stopped.

As shown in FIGS. 3 and 4, φs is input to the gate of PMOS 15 in the system based on the external power supply voltage extVcc. Therefore, instead of three inverters 73 for shaping the output waveform from the NAND circuit shown in FIG. 7, it is preferred to set the signal φs to the level of the external power supply voltage extVcc rather than the level of the internal power supply voltage intVcc, by using a level converting circuit.

Figure 9:
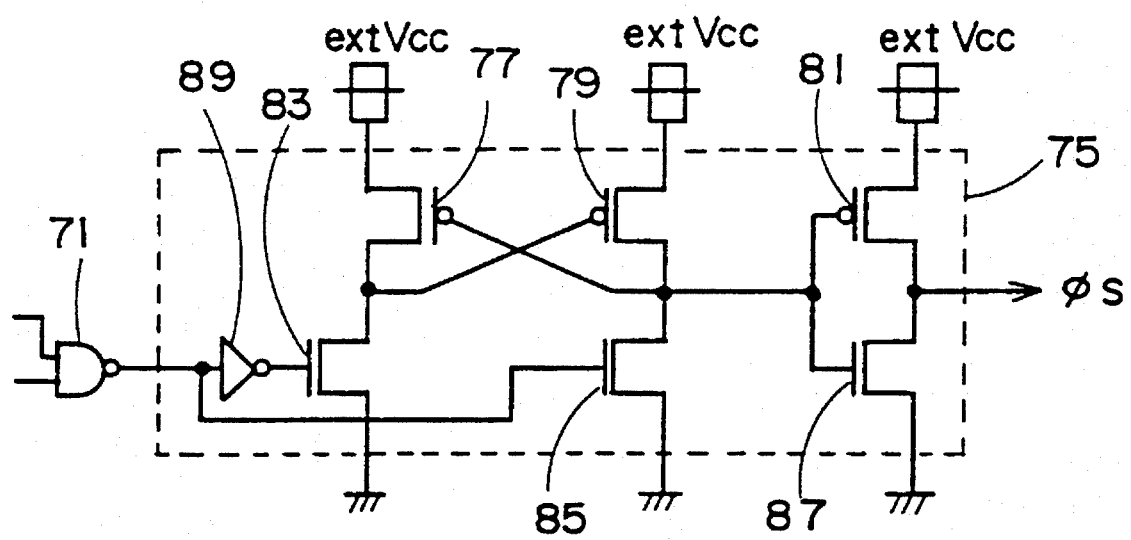
FIG. 9 is a schematic diagram showing details of the level converting circuit in accordance with the second embodiment.

FIG. 9 shows details of the level converting circuit 75 to be used in place of the inverter 73 of FIG. 8.

Referring to FIG. 9, level converting circuit 75 includes three PMOSs 77, 79, 81, three NMOSs 83, 85, 87 and an inverter 89.

As described above, in the present embodiment, the output of signal φs is controlled based on the result of comparison between the N channel sense amplifier activating signal SON and the signal ZSOPD which is provided by delaying the P channel sense amplifier activating signal ZSOP.

The signal φs is adapted to fall earlier than the N channel sense amplifier activating signal ZSOP to turn on the PMOS (corresponding to PMOS 15 of FIGS. 3 and 4) of the voltage down converter, so that a voltage is applied to the node of internal power supply voltage intVcc.

From the foregoing, the semiconductor memory device in accordance with the second embodiment prevents lowering of the level in the internal power supply voltage Vcc.

Figure 11:
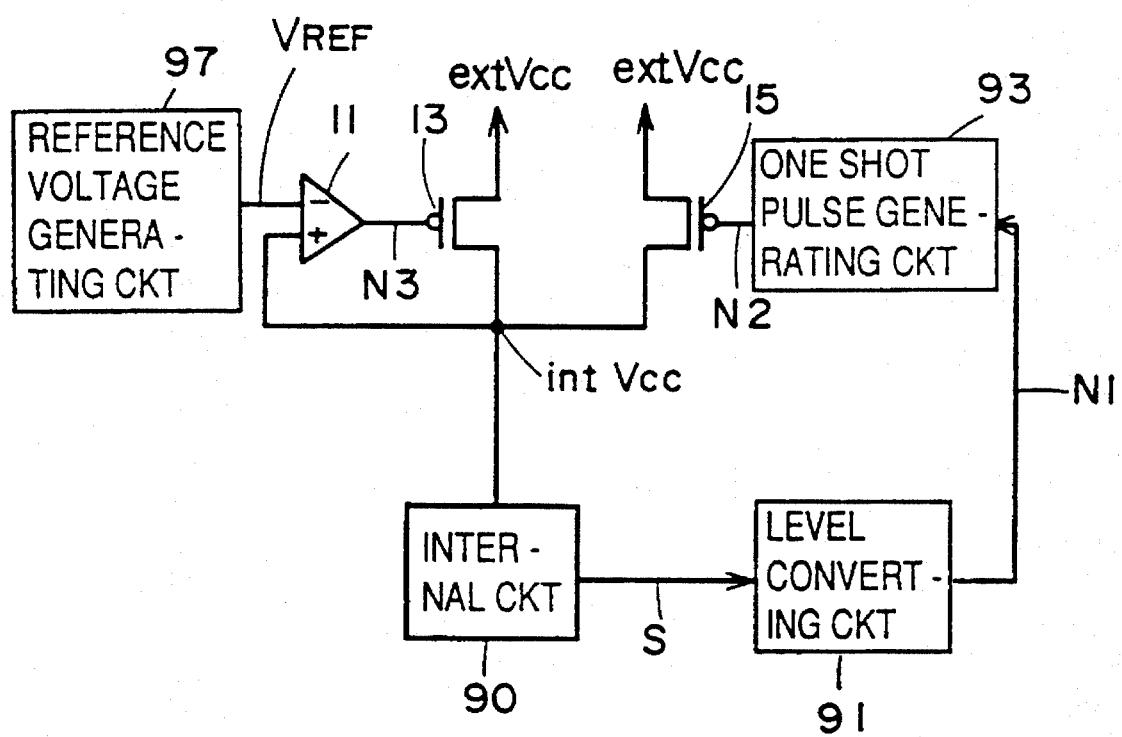
FIG. 11 is a schematic diagram showing an example of a semiconductor memory device having a conventional voltage down converter.
Figure 12:
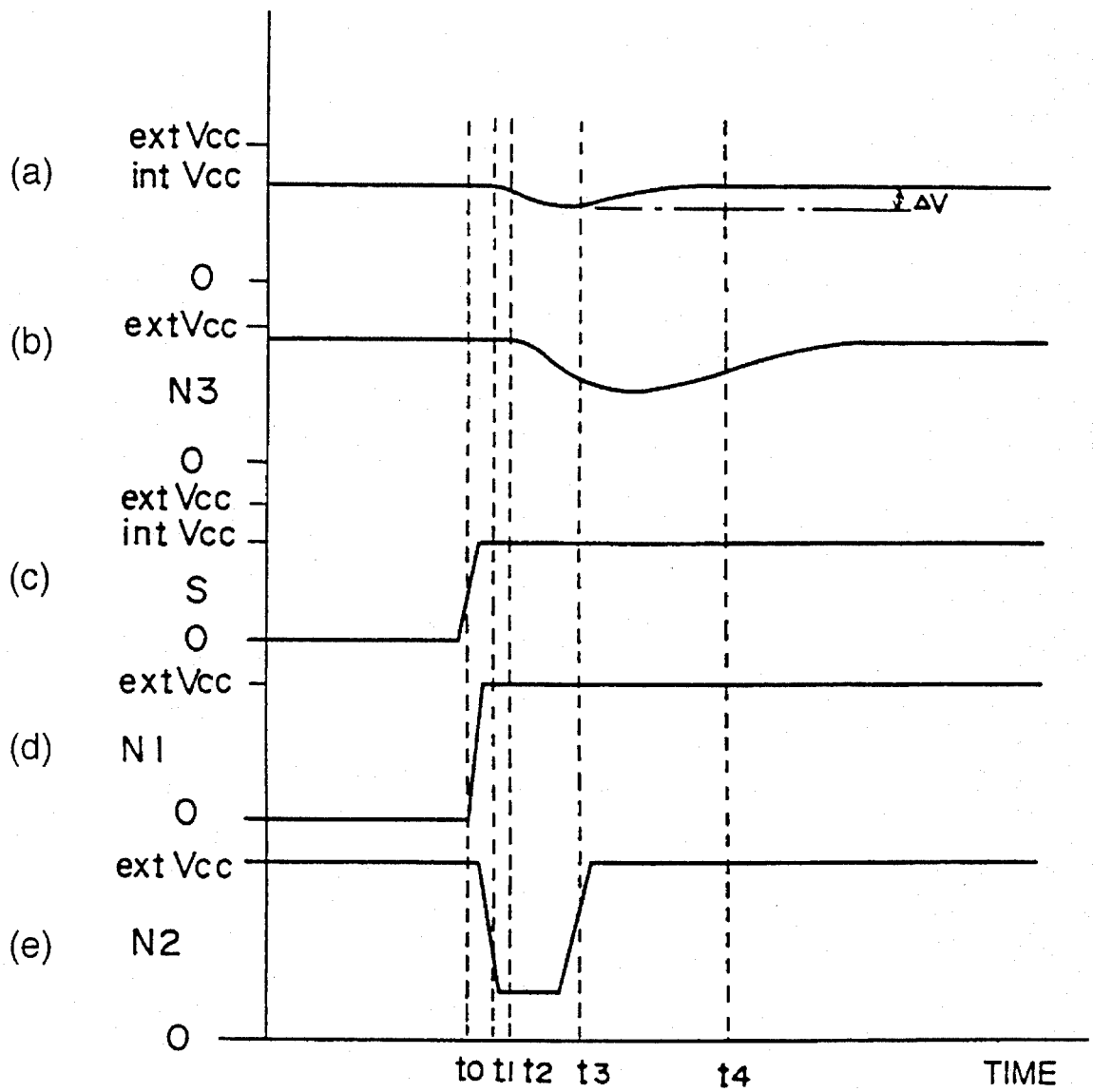
FIG. 12 is a diagram of waveforms of the semiconductor memory device having the conventional voltage down converter.

In the conventional voltage down converter shown in FIG. 11, the lowering of the level of internal power supply voltage intVcc in the internal circuitry (in the embodiment, P channel sense amplifier) is ΔV shown in FIG. 12.

As shown in FIG. 8, the lowering of the level in the embodiment is also the same ΔV. However, in the embodiment of the present invention, the lowering of the level viewed from the internal power supply voltage intVcc serving as the reference is small (ΔVint), and the time necessary for full recovery of the level is shorter.

As a result, a stable internal power supply voltage can be supplied in the semiconductor device.

Third Embodiment

The overall structure of the semiconductor memory device and the structure of the VDC in accordance with the third embodiment of the present invention are the same as those of the first embodiment.

The structure of the sense amplifier, the φs generating circuit and the level converting circuit in accordance with the third embodiment of the present invention are the same as those of the second embodiment.

Figure 10:
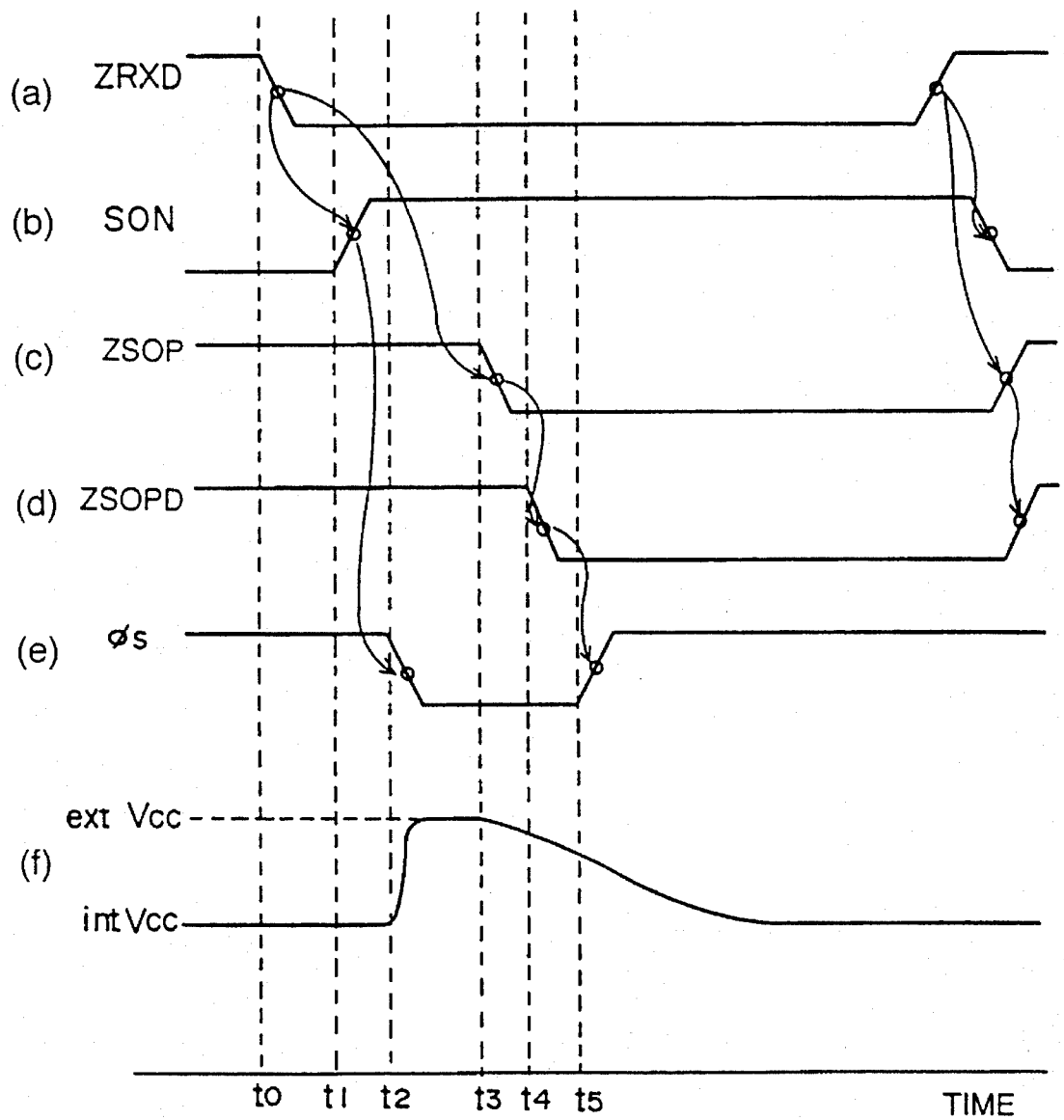
FIG. 10 shows waveforms of the φs generating circuit and the level of the internal power supply voltage intVcc in accordance with the third embodiment.

FIG. 10 shows the signal waveforms of the φs generating circuit and the voltage level of the internal power supply voltage intVcc when the internal power supply voltage intVcc at the level of the external power supply voltage extVcc is to be generated by the VDC.

Referring to FIG. 10, description of the waveforms of φs generating circuit is the same as that of the second embodiment.

In FIG. 10, when the signal φs starts to fall to the L level at an earlier time $t_2$ than the fall of the N channel sense amplifier activating signal ZSOP, PMOS 15 of the VDC shown in FIGS. 3 and 4 turns on, and the VDC generates the internal power supply voltage intVcc of the level of the external power supply voltage extVcc.

In order to avoid application of the internal power supply voltage intVcc of the level at the external power supply voltage extVcc for too long a time period, the time $t_5$ when the signal φs starts to rise is adjusted in accordance with the time $t_4$ when ZSOPD is adapted to fall.

As a result, the potential difference between the gate and source of each of the PMOSs 23 and 25 constituting the P channel sense amplifier shown in FIG. 6 is increased, and thus P channel sense amplifier operates faster.

Further, the potential difference between the drain and the source of each of the PMOSs 23 and 25 constituting the P channel sense amplifier is also large, and therefore drivability of the P channel sense amplifier is increased.

More specifically, according to the third embodiment of the present invention, in addition to the effects provided by the first and second embodiments described above, the speed of operation of the P channel sense amplifier in the whole semiconductor memory device can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a voltage down converter for generating an internal power supply voltage based on an external power supply voltage; and an internal circuitry operating in accordance with said internal power supply voltage; wherein said voltage down converter includes a first voltage lowering means for lowering said external power supply voltage supplied from an external power supply for generating said internal power supply voltage, first control means for providing a control signal for a prescribed time period in response to a signal for activating an internal circuitry, said first voltage lowering means being responsive to said control signal to begin operating before said internal circuitry is activated to begin consumption of the internal power supply voltage, reference voltage generating means for generating a reference voltage, second voltage lowering means connected parallel to said first voltage lowering means, for generating said internal power supply voltage by lowering said external power supply voltage, and second control means for controlling said second voltage lowering means in response to a result of comparison between said reference voltage and said internal power supply voltage.

2. The semiconductor memory device according to claim 1, wherein said internal circuitry is a potential difference amplifying means for amplifying potential difference between a pair of bit lines connected to a selected memory cell.

3. The semiconductor memory device according to claim 2, wherein said potential difference amplifying means is a sense amplifier.

4. The semiconductor memory device according to claim 3, wherein said first control means includes means for generating an internal signal by delaying a base signal based on a row address strobe signal, delay control means for controlling an amount of delay of an internal circuitry activating signal for operating said sense amplifier, and comparison and control means for controlling output of an operation signal for operating said first voltage lowering means in response to a result of comparison between delay signal generated from said delay control means and said internal signal generated earlier than said internal circuitry activating signal.

5. The semiconductor memory device according to claim 4, wherein said means for generating the internal signal includes a plurality of inverters.

6. The semiconductor memory device according to claim 4, wherein said delay control means includes a plurality of inverters.

7. The semiconductor memory device according to claim 4, wherein said comparison and control means is includes an NAND circuit.

8. The semiconductor memory device according to claim 3, wherein said first voltage lowering means generates said internal power supply voltage of the level of said external power supply voltage for a prescribed time period.

9. The semiconductor memory device according to claim 1, wherein said first and second voltage lowering means are transistors of a first conductivity type.

10. The semiconductor memory device according to claim 1, wherein said second control means is a current mirror amplifier.

11. The semiconductor memory device according to claim 1, wherein said second control means includes a current mirror amplifier and a level shifter.

* * * * *